United States Patent
Okazaki

(10) Patent No.: US 9,584,165 B2
(45) Date of Patent: Feb. 28, 2017

(54) HIGH FREQUENCY AMPLIFIER AND METHOD OF COMPENSATING FOR DISTORTION

(71) Applicant: Samsung Electronics Co., Ltd., Gyeonggi-do (KR)

(72) Inventor: Takashi Okazaki, Kanagawa (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/650,266

(22) PCT Filed: Dec. 6, 2013

(86) PCT No.: PCT/KR2013/011291
§ 371 (c)(1),
(2) Date: Jun. 5, 2015

(87) PCT Pub. No.: WO2014/088367
PCT Pub. Date: Jun. 12, 2014

(65) Prior Publication Data
US 2015/0318830 A1    Nov. 5, 2015

(30) Foreign Application Priority Data

Dec. 6, 2012 (JP) .................................. 2012-267513
Nov. 25, 2013 (KR) ........................ 10-2013-0143630

(51) Int. Cl.
*H04B 1/04* (2006.01)
*H03F 1/32* (2006.01)
(Continued)

(52) U.S. Cl.
CPC .......... *H04B 1/0475* (2013.01); *H03F 1/0205* (2013.01); *H03F 1/3247* (2013.01);
(Continued)

(58) Field of Classification Search
CPC ..................................................... H03F 1/3241
(Continued)

(56) References Cited

U.S. PATENT DOCUMENTS 6,275,685 B1  8/2001  Wessel et al.
6,320,461 B1  11/2001  Lee
(Continued)

FOREIGN PATENT DOCUMENTS

JP    2008-258713    10/2008
JP    2009-111958    5/2009
(Continued)

OTHER PUBLICATIONS

International Search Report dated Mar. 20, 2014 in connection with International Patent Application No. PCT/KR2013/011291, 4 pages.
(Continued)

*Primary Examiner* — Henry Choe

(57) ABSTRACT

Disclosed is a high frequency amplifier which can properly compensate for distortion generated in a power amplifier even when an observation band of a feedback signal is made narrow. The high frequency amplifier includes a data correction unit that corrects transmission data through a digital pre-distortion method, and the data correction unit includes an orthogonalizer that orthogonalizes and outputs respective order components of a polynomial model for the digital pre-distortion method, and a compensator that compensates for a memory effect of the power amplifier for an output of the orthogonalizer.

17 Claims, 5 Drawing Sheets

(51) Int. Cl.
*H03F 1/02* (2006.01)
*H03F 3/19* (2006.01)
*H03F 3/21* (2006.01)
*H03F 3/24* (2006.01)

(52) U.S. Cl.
CPC .............. *H03F 3/19* (2013.01); *H03F 3/21* (2013.01); *H03F 3/245* (2013.01); *H03F 2200/129* (2013.01); *H03F 2200/451* (2013.01); *H04B 2001/0425* (2013.01)

(58) Field of Classification Search
USPC ........................................ 330/149, 151, 291
See application file for complete search history.

(56) References Cited

U.S. PATENT DOCUMENTS

| | | | | |
|---|---|---|---|---|
| 8,649,746 B2* | 2/2014 | Kang | .................... | H04B 1/0028 330/149 |
| 8,779,851 B2* | 7/2014 | Anvari | .................. | H03F 1/3247 330/136 |
| 8,843,089 B2* | 9/2014 | Davies | .................. | H03F 1/3247 330/149 |
| 8,855,233 B2* | 10/2014 | Cai | .................. | H04L 25/03343 330/149 |
| 8,890,609 B2* | 11/2014 | Laporte | ................. | H03F 1/3247 330/149 |
| 8,933,752 B2* | 1/2015 | Nagatani | ............... | H03F 1/3247 330/149 |
| 9,041,464 B2* | 5/2015 | Komninakis | ......... | H03F 1/0244 330/127 |
| 2004/0119535 A1 | 6/2004 | Hunton et al. | | |
| 2007/0274471 A1* | 11/2007 | Shako | .................. | H03F 1/3247 379/88.01 |
| 2009/0115513 A1 | 5/2009 | Hongo et al. | | |
| 2011/0163805 A1 | 7/2011 | Brown et al. | | |
| 2011/0163806 A1 | 7/2011 | Hongo | | |

FOREIGN PATENT DOCUMENTS

| | | |
|---|---|---|
| KR | 10-2001-0104192 | 11/2001 |
| KR | 10-2005-0101210 | 10/2005 |

OTHER PUBLICATIONS

Written Opinion of International Searching Authority dated Mar. 20, 2014 in connection with International Patent Application No. PCT/KR2013/011291, 5 pages.

* cited by examiner

HIGH FREQUENCY AMPLIFIER AND METHOD OF COMPENSATING FOR DISTORTION

CROSS-REFERENCE TO RELATED APPLICATION(S)

The present application claims priority under 35 U.S.C. §365 to International Patent Application No. PCT/KR2013/011291 filed Dec. 6, 2013, entitled "HIGH FREQUENCY AMPLIFIER AND METHOD OF COMPENSATING FOR DISTORTION", and, through International Patent Application No. PCT/KR2013/011291, to Japanese Application No. 2012-267513 filed Dec. 6, 2012, and Korean Application No. 10-2013-0143630 filed Nov. 25, 2013, each of which are incorporated herein by reference into the present disclosure as if fully set forth herein.

TECHNICAL FIELD

The present disclosure relates generally to a high frequency amplifier and a method of compensating for distortion.

BACKGROUND ART

Power consumption of a power amplifier used in a radio base station tends to increase according to an increase in bandwidth of mobile and fixed radio communication, and therefore a high frequency amplifier for implementing high efficiency power amplification is required.

For the implementation of the high efficiency power amplification, a method of using a nonlinear operation of an amplification circuit is proposed as an example. A distortion compensation technology is indispensable for the nonlinear circuit using the method.

As an example of the distortion compensation method, a Pre-Distortion (PD) technique of reducing distortion of an entire system by adding a pre-distorted signal component such as reverse characteristics of nonlinearity of an amplifier with a nonlinear circuit to a transmission signal has been known. A Digital Pre-Distortion (DPD) technique has been known as a representative example of compensating for power distortion through the pre-distortion technique.

Technologies of compensating for distortion of a power amplifier through the pre-distortion method are disclosed in Japanese patent publication No. 2009-111958 (hereinafter, referred to as patent document 1) and No. 2008-258713 (hereinafter, referred to as patent document 2).

DISCLOSURE OF INVENTION

Technical Problem

The patent document 1 discloses a technology of efficiently applying coefficients for pre-distortion in a pre-distorter that compensates for distortion generated in an amplifier. The patent document 2 discloses a technology of reducing distortion of an output signal caused by a memory effect of a power amplifier as well as compensating for the distortion through the pre-distortion.

In the distortion compensation through the conventional DPD method, although an amplified signal is fed back by a power amplifier, a distortion signal out of a signal band also needs to be observed for calculation of an error between a signal processed by the DPD method and a feedback signal. Accordingly, an observation band is set to a value several times wider than the signal band. A high speed Analog to Digital (A/D) converter is required for setting a wide observation band. For example, when a band of a transmission signal is 20 MHz, an A/D converter having a sampling frequency of 100 MHz or higher is required. In general, as the A/D converter operates at a higher speed, power consumption and costs are further increased. Although efficiency of the power amplifier is improved by the DPD, if the power consumed by the DPD processing is increased, efficiency of the entire system is not improved.

Accordingly, a method of reducing power consumption by narrowing the observation band of the feedback signal through a low speed A/D converter may be considered. However, in the case of narrowing the observation band of the feedback signal through the low speed A/D converter, distortion is contained within most of the transmission signal band on account of loss of a distortion signal. If the observation band of the feedback signal is narrow, the distortion is likely to be out of the feedback observation band, and thus cannot be sufficiently compensated for.

Solution to Problem

In accordance with an aspect of the present disclosure, a high frequency amplifier includes: a data correction unit that corrects transmission data through a digital pre-distortion method, a power amplifier that amplifies output power of a transmission signal generated based on the corrected transmission data, a feedback signal output unit that outputs the amplified transmission signal as a feedback signal, and an error detector that calculates a correction value, used for correction in the data correction unit, by using the feedback signal and a reference signal output from the data correction unit. The data correction unit includes: an orthogonalizer that orthogonalizes and outputs respective order components of a polynomial model for the digital pre-distortion method, and a compensator that compensating for a memory effect of the power amplifier for an output of the orthogonalizer.

The compensator may be an FIR filter in which a delay interval is set based on a ratio of a sampling rate to a band of the feedback signal when the transmission signal is generated from the transmission data.

The delay interval may be adjusted according to the sampling rate and the band of the feedback signal.

The error detector may provide the calculated correction value to the FIR filter.

The high frequency amplifier may further include a D/A converter that converts the output of the data correction unit into an analog signal, wherein the signal converter may include an A/D converter that converts the feedback signal into a digital signal, and the D/A converter may operate at a high speed relative to the A/D converter.

The high frequency amplifier may further include a first filter that filters the output of the data correction unit, wherein the data converter may include a second filter that filters the feedback signal, and a pass band of the first filter may be wider than that of the second filter.

In accordance with another aspect of the present disclosure, a method of compensating for distortion is provided. The method includes: correcting transmission data through a digital pre-distortion method, amplifying output power of a transmission signal generated based on the corrected transmission data, outputting the amplified transmission signal as a feedback signal, and calculating and updating a correction value used for correcting the transmission data, by using the feedback signal and a reference signal used for correcting the data.

As described above, according to the present disclosure, the distortion generated in the power amplifier can be properly compensated for even in the case in which the observation band of the feedback signal is narrow.

Advantageous Effects of Invention

Accordingly, an aspect of the present disclosure is to provide a high frequency amplifier and a method of compensating for distortion, which can properly compensate for distortion generated in a power amplifier even when an observation band of a feedback signal is made narrow.

BRIEF DESCRIPTION OF DRAWINGS

The above and other aspects, features, and advantages of the present disclosure will be more apparent from the following detailed description taken in conjunction with the accompanying drawings, in which.

BEST MODE FOR CARRYING OUT THE INVENTION

Figure 1:
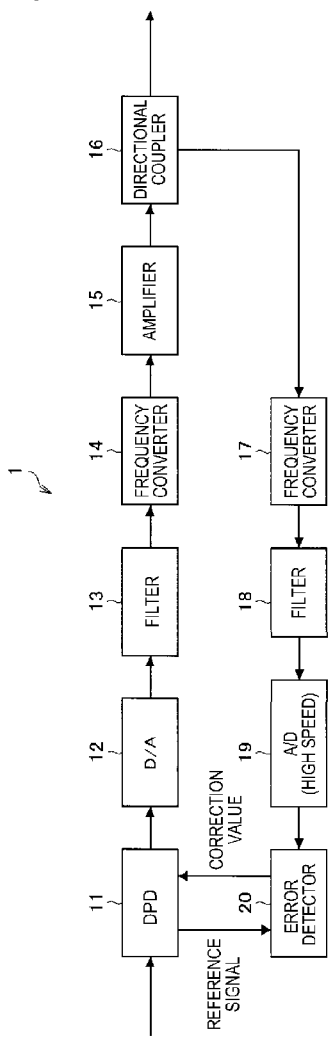
FIG. 1 is a block diagram illustrating an internal configuration of a conventional power amplifier employing a digital pre-distortion method for distortion compensation.

Hereinafter, various embodiments of the present disclosure will be described in detail with reference to the accompanying drawings. Furthermore, in the present specification and the drawings, elements having substantially identical functions and configurations are denoted by identical reference numerals and repetitive descriptions of them will be omitted.

1. Amplifier of the Related Art

First, prior to a specific description of the embodiments of the present disclosure, an exemplary configuration of the conventional power amplifier by the digital pre-distortion method will be represented, and at the same time, problems in the conventional amplifier employing a digital pre-distortion method for distortion compensation will be specifically described.

FIG. 1 is a block diagram illustrating an exemplary configuration of a conventional power amplifier 1 employing a digital pre-distortion method for distortion compensation. Hereinafter, the exemplary configuration of the conventional power amplifier 1 employing a digital pre-distortion method for distortion compensation will be described with reference to FIG. 1.

Referring to FIG. 1, the power amplifier 1 includes a Digital Pre-Distorter (DPD) 11, a Digital to Analog (D/A) converter 12, filters 13 and 18, frequency converters 14 and 17, an amplifier 15, a directional coupler 16, an Analog to Digital (A/D) converter 19, and an error detector 20.

The DPD 11 provides reverse characteristics of nonlinear characteristics of the amplifier 15 to a digital input signal by the digital pre-distortion method, and outputs the digital input signal. The DPD 11 outputs, to the D/A converter 12, the signal (the digital signal) provided with the reverse characteristics of the nonlinear characteristics of the amplifier 15, and at the same time, outputs the signal as a reference signal to the error detector 20. Here, it will be understood that the reverse characteristics of the nonlinear characteristics corresponds to pre-distorted signal components.

The D/A converter 12 converts the digital output signal from the DPD 11 into an analog signal and outputs the analog signal to the filter 13. The filter 13 filters the analog signal converted by the D/A converter 12 to remove, from the analog signal, a return signal at a time of sampling and outputs the filtered signal to the frequency converter 14. The frequency converter 14 converts the signal (the analog signal) of the baseband passed through the filter 13 into a signal (an analog signal) of the Radio Frequency (RF) band, and outputs the converted analog signal.

The amplifier 15 amplifies the signal (the analog signal) output from the frequency converter 14 by a predetermined amount and outputs the amplified signal. Since the reverse characteristics of the nonlinear characteristics of the amplifier 15 are provided in advance in the DPD 11, the offset and undistorted signal (the analog signal) is output from an antenna when the amplifier 15 amplifies the signal.

The directional coupler 16 outputs, to the antenna (not illustrated), the transmission signal (the analog signal) output from the amplifier 15 after the power amplification, and at the same time, outputs the transmission signal (the analog signal) as a feedback signal to the frequency converter 17.

The frequency converter 17 converts the signal (the analog signal) of the RF band output from the directional coupler 16 into a signal (an analog signal) of the baseband, and outputs the converted signal. The filter 18 removes a frequency band from the signal to prevent occurrence of return at a time of sampling in the A/D converter 19, and then outputs the signal. The A/D converter 19 converts the analog signal having passed through the filter 18 into a digital signal and outputs the digital signal.

The error detector 20 obtains an error between the signal provided with the reverse characteristics of the nonlinear characteristics of the amplifier 15 by the DPD 11 and the feedback signal output from the A/D converter 19, and calculates a correction value to be provided to the DPD 11. The power amplifier 1 illustrated in FIG. 1 may perform an adaptive control in correspondence to a change in an environment and time, by calculating the correction value for minimizing the error between the signal output from the error detector 20 and the DPD 11 and the feedback signal, and updating the correction value used by the DPD 11.

Although various nonlinear characteristic models to be installed in the DPD 11 are proposed, for example, a memory polynomial model considering a previous input as expressed in the following Math Figure 1 is used.

MathFigure 1

$$y_t = \sum_{n=1}^{N} \sum_{m=0}^{M-1} b_{nm} |x_t - m|^{n-1} (x_{t-m})$$ [Math. 1]

In Math Figure 1, $y_t$ denotes a signal output from the DPD 11 at time t, $x_t$ denotes a signal input to the DPD 11 at time t, and m denotes the number of samples representing an extent to which a previous input is to be considered. Accordingly, $x_{t-m}$ denotes a signal input to the DPD 11 at a time point prior, by m samples, to the time point t. Further, n denotes an order, and $b_{nm}$ denotes an nth order distortion compensation coefficient for the input signal $x_{t-m}$ which is m samples prior to the time point t.

In the power amplifier 1 illustrated in FIG. 1, the correction value calculated by the error detector 20 is a coefficient $b_{nm}$ of each order that is calculated from the error between the signal output from the DPD 11 and the feedback signal to be suitable for the model as expressed in Math Figure 1.

While the conventional power amplifier 1 as illustrated in FIG. 1 may compensate for the distortion by the amplifier 15 through the digital pre-distortion method, the conventional power amplifier has the following problems.

First, the error detector 20 needs to observe a distortion signal out of a band of the transmission signal as well, in order to calculate an accurate error between the signal output from the DPD 11 and the feedback signal.

Figure 2:
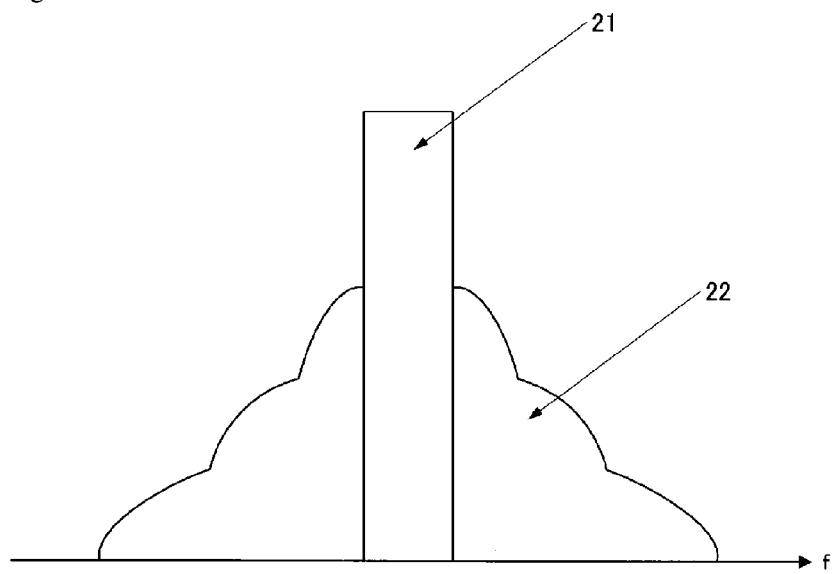
FIG. 2 is a view illustrating a relationship between a band of a transmission signal and an observation band of a signal containing distortion generated in the amplifier.

FIG. 2 is a view illustrating a relationship between a band of a transmission signal and an observation band of a signal containing distortion generated in the amplifier. In FIG. 2, reference numeral 21 denotes the transmission signal, and reference numeral 22 denotes the signal containing the distortion generated in the amplifier. Further, a horizontal axis of FIG. 2 denotes frequencies (f).

As illustrated in FIG. 2, the error detector 20 needs to observe the distortion signal out of the band of the transmission signal as well, in order to calculate an accurate error between the signal output from the DPD 11 and the feedback signal. An operation (or a sampling operation) of the A/D converter 19 needs to be performed at a higher speed for making an observation band of the feedback signal wide. For example, when the band of the transmission signal is 20 MHz, a sampling frequency of 100 MHz or higher is necessary for the A/D converter 19. In general, as the A/D converter operates at a higher speed, the power consumption and costs are further increased. Accordingly, although efficiency of the power amplifier is improved by the DPD, if a large amount of power is consumed for the DPD processing, consequently, efficiency of the entire system is not improved. If an A/D converter that operates at a lower speed is used in the power amplifier in order to reduce the power consumption of the DPD processing, the observation band of the feedback signal becomes narrower.

Figure 3:
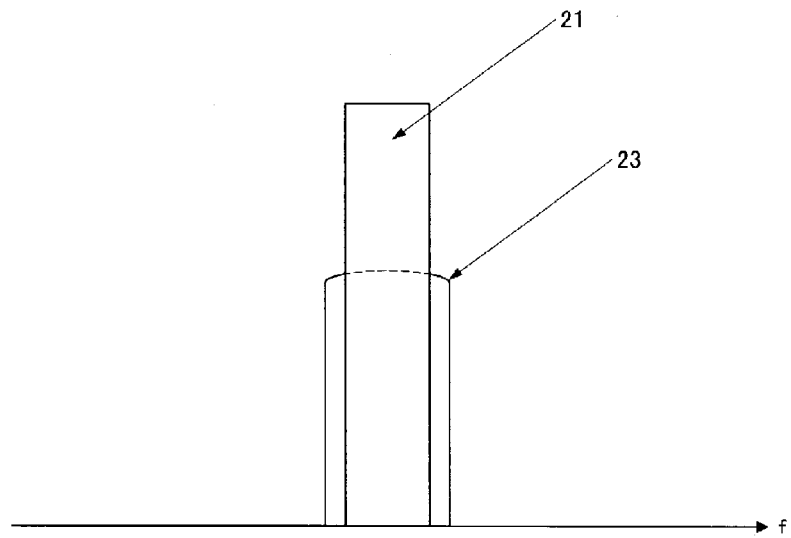
FIG. 3 is a view illustrating a relationship between a band of a transmission signal and an observation band of a signal containing distortion generated in the amplifier.

FIG. 3 is a view illustrating a relationship between a band of a transmission signal and an observation band of a signal containing distortion generated in the amplifier, in which the observation band of the signal containing the distortion is narrower as compared with that of FIG. 2 and is set to a band to the same degree as the band of the transmission signal. In FIG. 3, reference numeral 21 denotes the transmission signal, and reference numeral 23 denotes the signal containing the distortion generated in the amplifier. Further, a horizontal axis of FIG. 3 denotes frequencies (f). As illustrated in FIG. 3, when the observation band of the feedback signal becomes narrower, a distortion signal is lost and mostly contained within the band of the transmission signal. In the case of the general memory polynomial model as described above, there is a correlation between respective order components of the distortion contained within the transmission signal, and therefore it is difficult to determine an nth order distortion compensation coefficient $b_{nm}$.

Further, in the case of the general memory polynomial model as described above, when the band of the feedback signal becomes narrower, error information is lost. Accordingly, when the band of the feedback signal becomes narrower, a distortion compensation coefficient $b_{nm}$ of a sample delay interval of the transmission signal cannot be estimated from the error information so that the distortion out of the observation band is likely to be left.

Accordingly, a power amplifier and a method of compensating for distortion by using the power amplifier, which can compensate for distortion generated in an amplifier even in the case in which the observation band of the feedback signal is set to the band to the same degree as the band of the transmission signal as illustrated in FIG. 3, will be described below.

2. Embodiment of the Present Disclosure

Exemplary Configuration of a Power Amplifier

Figure 4:
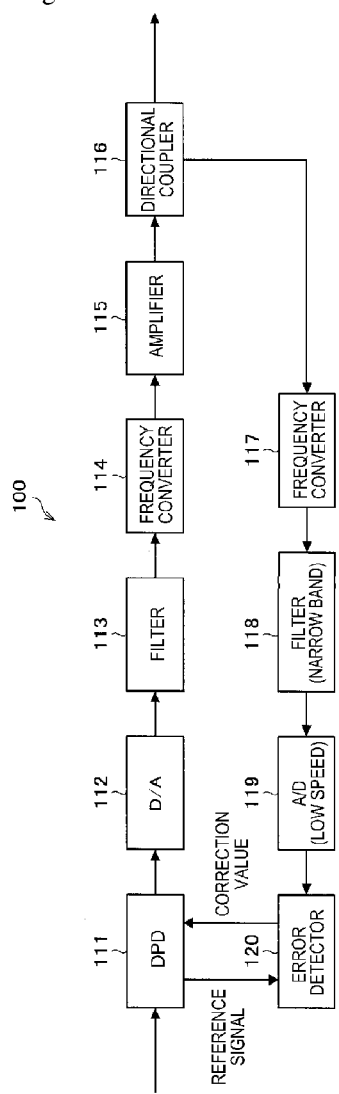
FIG. 4 is a block diagram illustrating an internal configuration of a power amplifier according to an embodiment of the present disclosure.

FIG. 4 is a block diagram illustrating an internal configuration of a power amplifier according to an embodiment of the present disclosure. Hereinafter, an exemplary configuration of a power amplifier 100 according to the embodiment of the present disclosure will be described.

As illustrated in FIG. 4, the power amplifier 100 according to the embodiment of the present disclosure includes a Digital Pre-Distorter (DPD) 111, a Digital to Analog (D/A) converter 112, filters 113 and 118, frequency converters 114 and 117, an amplifier 115, a directional coupler 116, an Analog to Digital (A/D) converter 119, and an error detector 120.

The DPD 111 provides reverse characteristics of nonlinear characteristics of the amplifier 115 to a digital input signal by the digital pre-distortion method, and outputs the digital input signal. The DPD 111 outputs, to the D/A converter 112, the signal (the digital signal) provided with the reverse characteristics of the nonlinear characteristics of the amplifier 115, and at the same time, outputs the signal (the digital signal), provided with the reverse characteristics of the nonlinear characteristics, as a reference signal to the error detector 120.

In the embodiment of the present disclosure, the DPD 111 may compensate for distortion generated in the amplifier 115, even in the case in which an observation band of a feedback signal is a band to the same degree as a band of a transmission signal. The DPD 111 will be described below more specifically.

The D/A converter 112 converts the digital output signal from the DPD 111 into an analog signal and outputs the analog signal to the filter 113. The filter 113 filters the analog signal to remove, from the analog signal, a return signal at a time of sampling and outputs the filtered signal to the frequency converter 114. The frequency converter 114 converts the signal (the analog signal) of the baseband passed through the filter 113 into a signal (an analog signal) of the Radio Frequency (RF) band, and outputs the converted analog signal.

The amplifier 115 amplifies the signal (the analog signal) output from the frequency converter 114 by a predetermined amount and outputs the amplified signal. Since the reverse characteristics of the nonlinear characteristics of the amplifier 115 is provided in advance in the processing process of the DPD 111, the offset and undistorted signal (the analog signal) is output from an antenna when the amplifier 115 amplifies the signal.

The directional coupler 116 as an example of a feedback signal output unit of the present disclosure outputs the transmission signal (the analog signal) amplified by the amplifier 115 to the antenna (not illustrated), and at the same time, outputs the transmission signal (the analog signal) as a feedback signal to the frequency converter 117.

The frequency converter 117 converts the signal (the analog signal) of the RF band output from the directional coupler 116 into a signal (an analog signal) of the baseband, and outputs the converted signal. The filter 118 removes a frequency band from the signal such that return is not made at a time of sampling in the A/D converter 119, and outputs the signal. The A/D converter 119 converts the analog signal filtered by the filter 18 into a digital signal and outputs the digital signal.

A pass band of the filter 118 is preferably equal to or 1.5 times wider than that of the filter 113. Further, it is preferable to use the A/D converter 119 operating at a low speed relative to the A/D converter 19 used in the conventional power amplifier 1 as illustrated in FIG. 1.

The error detector 120 calculates an error between the signal provided with the reverse characteristics of the nonlinear characteristics of the amplifier 115 by the DPD 11 and the feedback signal output from the A/D converter 119, and calculates, based on the calculated error, a correction value to be provided to the DPD 111.

Namely, the error detector 120 calculates a correction value for minimizing the error between the signal output from the DPD 111 and the feedback signal, and updates the correction value used by the DPD 111.

The power amplifier 100 according to the embodiment of the present disclosure has the configurations as illustrated in FIG. 4, and may properly compensate for the distortion generated in the amplifier, even in the case in which the observation band of the feedback signal is a band to the same degree as the band of the transmission signal.

The internal configuration of the power amplifier 100 according to the embodiment of the present disclosure has been described above with reference to FIG. 4. Next, the DPD 111 included in the power amplifier 100 according to the embodiment of the present disclosure will be described below more specifically.

Exemplary Configuration of DPD

Figure 5:
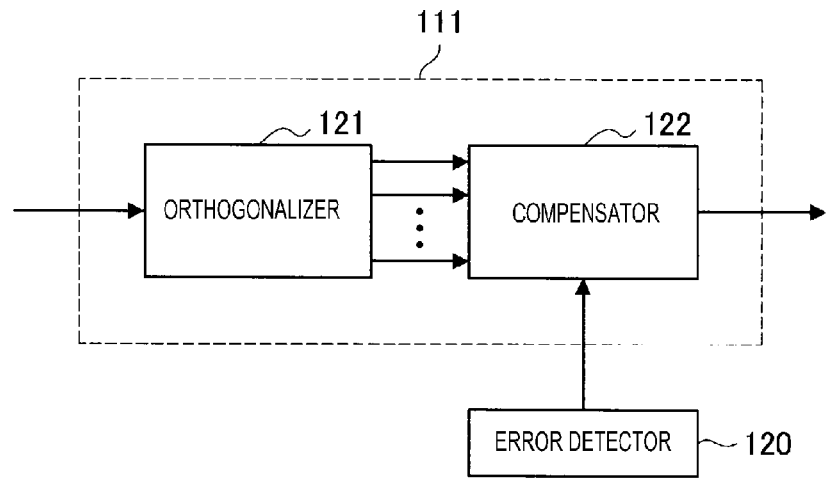
FIG. 5 is a block diagram illustrating an exemplary configuration of a DPD according to an embodiment of the present disclosure.

FIG. 5 is a block diagram illustrating an internal configuration of a DPD according to an embodiment of the present disclosure.

As illustrated in FIG. 5, the DPD 111 included in the power amplifier 100 according to the embodiment of the present disclosure includes an orthogonalizer 121 and a compensator 122.

The orthogonalizer 121 orthogonalizes respective order components of a polynomial model for the DPD method and outputs the orthogonalized components to the compensator 122, in response to a signal input to the DPD 111. The orthogonalizer 121 which orthogonalizes the respective order components of the polynomial model makes it possible to independently detect the respective order components.

In the embodiment of the present disclosure, the orthogonalizer 121 orthogonalizes the respective order components of the polynomial model for the DPD method, by using, for example, an orthogonalization algorithm of Gram-schmidt. A brief description of the orthogonalization algorithm of Gram-schmidt will be given as follows. First, a general polynomial model will be given by the following Math Figure 2.

MathFigure 2

$$y = \sum_{n=1}^{N} b_n |x|^{n-1} x \qquad [\text{Math. 2}]$$

The general polynomial model given by Math Figure 2 may be transformed into an orthogonalization model such as the following Math Figures 3, 4, and 5.

MathFigure 3

$$y = \sum_{n=1}^{N} c_n u_n \quad \langle u_m, u_n \rangle = 0 \qquad [\text{Math. 3}]$$

MathFigure 4

$$u_n = |x|^{n-1} x - \sum_{m=1}^{n-1} \alpha_{nm} u_m \qquad [\text{Math. 4}]$$

MathFigure 5

$$\alpha_{nm} = \frac{\langle |x|^{n-1} x, u_m \rangle}{\|u_m\|^2} \qquad [\text{Math. 5}]$$

As described above, the respective orthogonalized order components Un are orthogonalized by subtracting a lower-order correlation component from the respective order components $|x|^{n-1}x$ of the polynomial model given by Math Figure 2. "$\langle \rangle$" in Math Figure 5 denotes an inner product of vectors, and time-based data is regarded as a vector. For example, $\langle u_m, u_n \rangle$ is defined by the following Math Figure 6.

MathFigure 6

$$\langle u_m, u_n \rangle = \sum_{i=1}^{N} u_{m,i} u_{n,i}^* \qquad [\text{Math. 6}]$$

Where, $u^*_{n,i}$ denotes a conjugate complex number of $u_{n,i}$. Further, in Math Figure 5, $\|u_m\|$ denotes a norm of a vector $u_m$.

The compensator 122 compensates for a memory effect in the amplifier 115 for the respective order components of the input signal which have been orthogonalized by the orthogonalizer 121, and adds and outputs the respective order components. The compensator 122 uses the correction value calculated by the error detector 120 when compensating for the memory effect in the amplifier 115.

In the embodiment of the present disclosure, a Finite Impulse Response (FIR) filter is used in the compensator 122 for the compensation of the memory effect in the amplifier 115. The compensator 122 may compensate for the memory effect in the amplifier 115, considering a previous input through the FIR filter. Here, a delay interval δ in the FIR filter is defined as below for correspondence to narrowing of the band of the feedback signal.

MathFigure 7

$$\delta = \text{round}(TX\text{sampling\_rate}/FB\_BW) \quad [\text{Math.7}]$$

Figure 7:
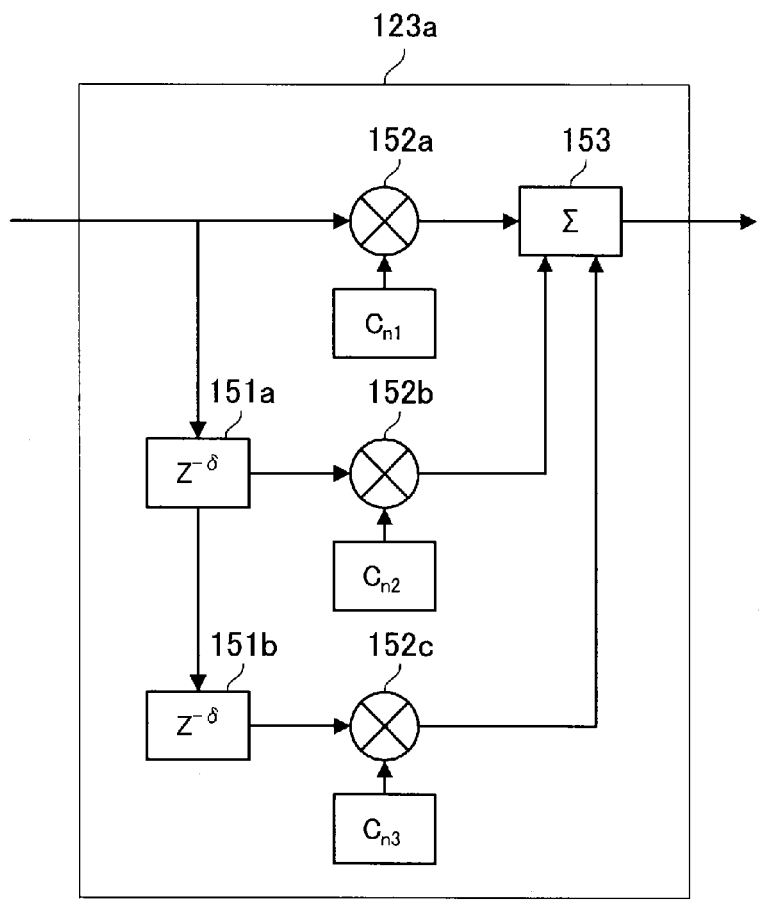
FIG. 7 is a view illustrating a specific exemplary configuration of an FIR filter included in the compensator according to the embodiment of the present disclosure.

In Math Figure 7, TXsampling_rate denotes a sampling rate of a transmission signal, and FB_BW denotes a bandwidth of a feedback signal.

Figure 8:
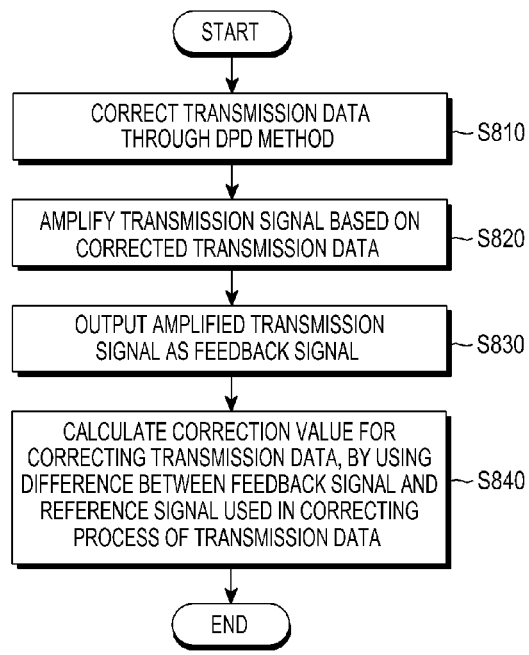
FIG. 8 is a flowchart illustrating a method of compensating for distortion according to an embodiment of the present disclosure.

The DPD 111 is configured as in FIG. 5, and therefore an output signal $y_t$ from the DPD 111 at time t may be given by the following Math Figure 8.

MathFigure 8

$$y_t = \sum_{\lambda=0}^{M} c_{n\lambda} u_{1(t-\delta\lambda)} + \sum_{n=1}^{N} \sum_{\lambda=0}^{M} c_{n\lambda} u_{n(t-\delta\lambda)} \quad [\text{Math. 8}]$$

As can be seen from Math Figure 8, the DPD 111 may output an output signal $y_t$ that may be divided into a linear component (a front portion) exerting an influence on a signal band and a nonlinear distortion component (a rear portion) exerting an influence on a band other than the signal band.

The power amplifier 100 according to the embodiment of the present disclosure has been described above with reference to FIG. 5. Next, a specific exemplary configuration of the orthogonalizer 121 and the compensator 122 will be described more specifically.

Figure 6:
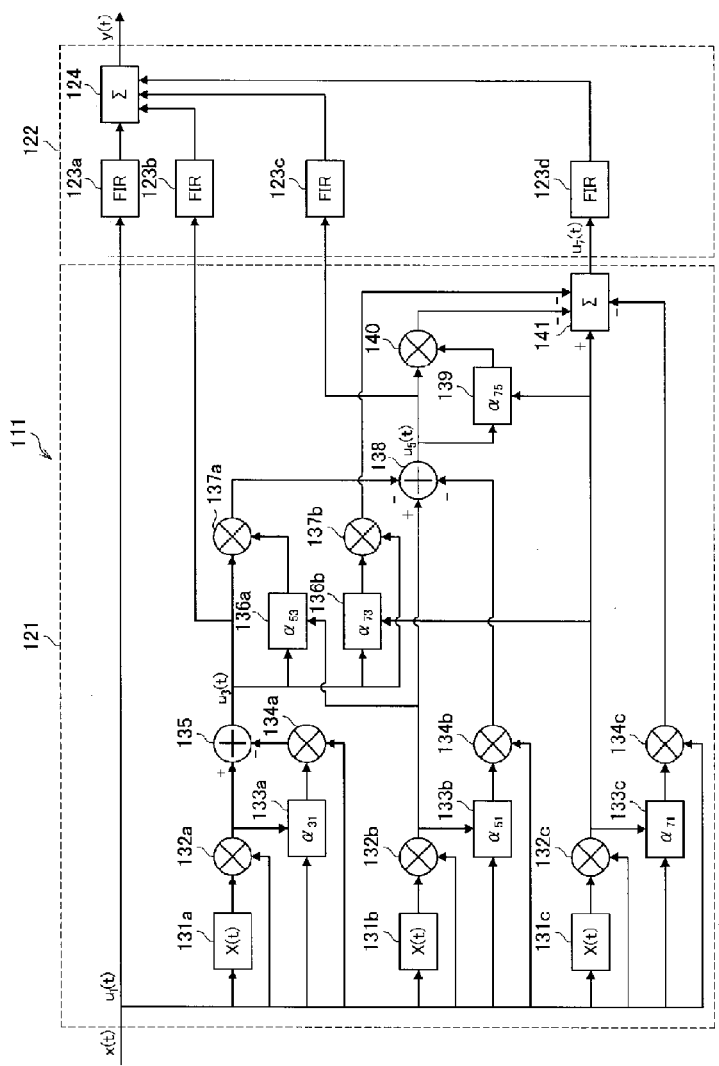
FIG. 6 is a view illustrating a specific exemplary configuration of an orthogonalizer according to an embodiment of the present disclosure.

FIG. 6 is a view illustrating a specific exemplary configuration of an orthogonalizer 121 according to an embodiment of the present disclosure. Hereinafter, a specific configuration and an operation of the orthogonalizer 121 according to the embodiment of the present disclosure will be described with reference to FIG. 6.

FIG. 6 illustrates the above-described orthogonalization model, more particularly, a configuration of the orthogonalizer 121 for obtaining $u_n$ represented in Math Figure 4. Further, FIG. 6 illustrates a configuration of the orthogonalizer 121 when n=1, 3, 5, and 7.

Square operation units 131$a$, 131$b$, and 131$c$ raise an absolute value of a signal x(t) sent to the orthogonalizer 121 to the $2^{nd}$, $4^{th}$, and $6^{th}$ power, respectively. The square operation unit 131$a$ raises x(t) to the power of 2 and outputs x(t) raised to the $2^{nd}$ power, the square operation unit 131$b$ raises x(t) to the power of 4 and outputs x(t) raised to the $4^{th}$ power, and the square operation unit 131$c$ raises x(t) to the power of 6 and outputs x(t) raised to the $6^{th}$ power.

Multipliers 132$a$, 132$b$, and 132$c$ multiply x(t) raised to the $2^{nd}$, $4^{th}$, and $6^{th}$ power by x(t), respectively. An output of the multiplier 132$b$ is used to calculate a coefficient in a coefficient calculating unit 136$a$ which will be described below, and an output of the multiplier 132$c$ is used to calculate a coefficient in coefficient calculating units 136$b$ and 139 which will be described below.

Figure 9:
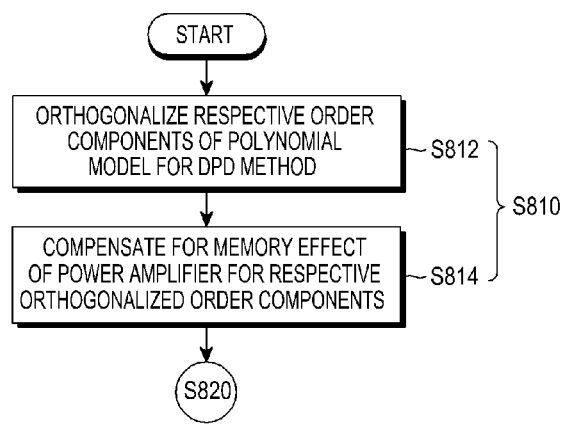
FIG. 9 is a flowchart more specifically illustrating the transmission data correction process of FIG. 8.

First, a third order component will be described as an example for the next processing. After the multiplier 132$a$ multiplies the absolute value of x(t) raised to the $2^{nd}$ power by x(t), a coefficient calculating unit 133$a$ calculates a coefficient $\alpha_{31}$ from x(t) and the output of the multiplier 132$a$. The coefficient $\alpha_{31}$ as expressed in Math Figure 9 is obtained by Math Figure 5. Further, (t) representing time t is omitted in Math Figure 9 below.

MathFigure 9

$$\alpha_{31} = \frac{\langle |x|^2 x, x \rangle}{\|x\|^2} \quad [\text{Math. 9}]$$

After the coefficient $\alpha_{31}$ is calculated in the coefficient calculating unit 133$a$, a multiplier 134$a$ multiplies the coefficient $\alpha_{31}$ by x(t) and outputs the coefficient $\alpha_{31}$ multiplied by x(t). An adder 135 receives the output of the multiplier 132$a$ as a positive input and the output of the multiplier 134$a$ as a negative input, and adds the output of the multipliers 132$a$ and 134$a$ to create the third order component $u_3$ orthogonal to the input signal. The third order component $u_3$ is represented by Math Figure 10 below.

MathFigure 10

$$u_3 = |x|^2 x - \alpha_{31} x \quad [\text{Math.10}]$$

The third order component $u_3$ is output to an FIR filter 123$b$ and at the same time, is used to calculate coefficients $\alpha_{53}$ and $\alpha_{73}$ in the coefficient calculating units 136$a$ and 136$b$. Further, multiplier 137$a$ multiplies the coefficient $\alpha_{53}$ output from the coefficient calculating unit 136$a$ by the third order component $u_3$.

Next, a fifth order component will be described as an example. After the multiplier 132$b$ multiplies the absolute value of x(t) raised to the $4^{th}$ power by x(t), a coefficient calculating unit 133$b$ calculates a coefficient $\alpha_{51}$ from x(t) and the output of the multiplier 132$b$.

After the coefficient $\alpha_{51}$ is calculated in the coefficient calculating unit 133$b$, a multiplier 134$b$ multiplies the coefficient $\alpha_{51}$ by x(t) and outputs the coefficient $\alpha_{51}$ multiplied by x(t). An adder 138 receives the output of the multiplier 132$b$ as a positive input and the output of the multipliers 134$b$ and 137$a$ as a negative input, and adds the output of the multipliers 132$b$, 134$b$, and 137$a$ to create the fifth order component $u_5$ orthogonal to the input signal.

The fifth order component $u_5$ is output to an FIR filter 123$c$ and at the same time, is used to calculate a coefficient $\alpha_{75}$ in the coefficient calculating units 139. Further, multiplier 140 multiplies the coefficient $\alpha_{75}$ output from the coefficient calculating unit 139 by the fifth order component $u_5$.

Last, a seventh order component will be described as an example. After the multiplier 132$c$ multiplies the absolute value of x(t) raised to the $6^{th}$ power by x(t), a coefficient calculating unit 133$c$ calculates a coefficient $\alpha_{71}$ from x(t) and the output of the multiplier 132$c$.

After the coefficient $\alpha_{71}$ is calculated in the coefficient calculating unit 133$c$, a multiplier 134$c$ multiplies the coefficient $\alpha_{71}$ by x(t) and outputs the coefficient $\alpha_{71}$ multiplied by x(t). An adder 141 receives the output of the multiplier 132$c$ as a positive input and the output of the multipliers 134$c$, 137$b$, and 140 as a negative input, and adds the output of the multipliers 132$c$, 134$c$, 137$b$, and 140 to create the seventh order component $u_7$ orthogonal to the input signal. The seventh order component $u_7$ is output to an FIR filter 123$d$.

The orthogonalizer 121 has the configuration as illustrated in FIG. 6 and executes the above-described operations, thereby orthogonalizing the respective order components of the polynomial model and independently detecting the respective order components.

FIG. 7 is a block diagram illustrating an internal configuration of an FIR filter included in the compensator 122 according to the embodiment of the present disclosure. Hereinafter, an exemplary configuration and operation of the FIR filter included in the compensator 122 according to the embodiment of the present disclosure will be described with reference to FIG. 7.

An FIR filter 123a illustrated in FIG. 7 performs, for example, filter processing for a first order component $u_1$. As illustrated in FIG. 7, the FIR filter 123a includes delay units 151a and 151b, multipliers 152a, 152b, and 152c, and an adder 153.

The delay units 151a and 151b delay an input by a delay interval δ and outputs the delayed input. The delay interval δ is a delay interval defined by Math Figure 7 described above, and is set from a sampling rate of a transmission signal and a bandwidth of a feedback signal.

The multiplier 152a multiplies the input by a coefficient $c_{n1}$ to output the input, the multiplier 152b multiplies the input delayed by δ by a coefficient $c_{n2}$ to output the delayed input, and the multiplier 152c multiplies the input delayed by 2δ by a coefficient $c_{n3}$ to output the delayed input. Here, n denotes an order. Further, the coefficients by which the respective multipliers multiply the input are coefficients used to approximate an error signal err as expressed in Math Figure 11 below.

MathFigure 11

$$err = \sum_{\lambda=0}^{M-1} x_{(t-\delta\lambda)}c_{1\lambda} + \sum_{\lambda=0}^{M-1} u_{3(t-\delta\lambda)}c_{3\lambda} + \sum_{\lambda=0}^{M-1} u_{5(t-\delta\lambda)}c_{5\lambda} + \sum_{\lambda=0}^{M-1} u_{7(t-\delta\lambda)}c_{7\lambda}$$

[Math. 11]

Math Figure 11 above is obtained by modeling an error between a signal output from a DPD 111 and a feedback signal in the form of a mathematical expression, and coefficients $c_{1\lambda}$, $c_{3\lambda}$, $c_{5\lambda}$, and $c_{7\lambda}$ in Math Figure 11 may be obtained by using an adaptive algorithm such as a Least Mean Square (LMS) algorithm.

Further, although the FIT filter 123a illustrated in FIG. 7 includes two delay units 151a and 151b, and three multipliers 152a, 152b, and 152c, the configuration of the FIR filter used in the compensator 122 of the present disclosure is not limited thereto.

Referring back to FIG. 6, the outputs of the FIR filters 123a, 123b, 123c, and 123d are added in an adder 124. The addition result of the adder 124 corresponds to an output from the DPD 111, and is prescribed by Math Figure 12 below.

MathFigure 12

$$y_t = y_{1t} + y_{3t} + y_{5t} + y_{7t}$$

[Math.12]

The orthogonalizer 121 and the compensator 122 have the configuration as illustrated in FIGS. 6 and 7, and may output an output signal $y_t$ that may be divided into a linear component (a front portion) exerting an influence on a signal band and a nonlinear distortion component (a rear portion) exerting an influence on a band other than the signal band.

The specific configuration and the operation of the orthogonalizer 121 and the compensator 122 have been described above.

As described above, the present disclosure may provide the power amplifier 100 which can properly compensate for the distortion generated in the power amplifier even in the case in which the observation band of the feedback signal is made narrow.

The power amplifier 100 according to the embodiment of the present disclosure may sufficiently compensate for the distortion even in the case of the narrow observation band, so that an A/D converter with low cost and low power consumption may be used for reception of the feedback signal. Accordingly, the power amplifier 100 according to the embodiment of the present disclosure may reduce the power consumption and costs used to compensate for the distortion.

Further, the power amplifier 100 according to the embodiment of the present disclosure does not need an observation band other than the band of the transmission signal, and thus can widen a band capable of compensating for the distortion through the DPD method.

FIG. 8 is a flowchart illustrating a method of compensating for distortion according to an embodiment of the present disclosure, and FIG. 9 is a flowchart more specifically illustrating the transmission data correction process of FIG. 8.

Referring to FIG. 8, a process of correcting transmission data according to a Digital Pre-Distortion (DPD) method is performed in step S810. As illustrated in FIG. 9, the process of correcting the transmission data in step 810 includes a process of orthogonalizing and outputting respective order components of a polynomial model for the digital pre-distortion method in step S812, and a process of correcting a memory effect of a power amplifier for an output of an orthogonalizer in step S814.

A process of amplifying output power of the generated transmission signal based on the corrected transmission data is performed in S820. Next, in step S830, the amplified transmission signal is output as a feedback signal, and at the same time, is output to an output unit. In step S840, a correction value for minimizing a difference between the transformed feedback signal and a reference signal output from a data correction unit is calculated, in which the correction value is to be used for correction in the data correction unit.

While the present disclosure has been shown and described with reference to certain embodiments thereof, it will be understood by those skilled in the art that various changes in form and details may be made therein without departing from the spirit and scope of the present disclosure as defined by the appended claims.

The invention claimed is:
1. A high frequency amplifier comprising:
a data correction unit configured to correct transmission data based on digital pre-distortion;
a power amplifier configured to amplify output power of a transmission signal generated as a function of the corrected transmission data;
a feedback signal output unit configured to output the amplified output power of the transmission signal; and
an error detector configured to calculate a correction value to correct the transmission data based on a feedback signal output from the feedback signal output unit and a reference signal output from the data correction unit, wherein the data correction unit comprises:
an orthogonalizing unit configured to orthogonalize respective order components of a polynomial model for the digital pre-distortion; and
a compensation unit configured to compensate for a memory effect of the power amplifier for an output of the orthogonalizing unit.

2. The high frequency amplifier of claim 1, wherein the correction value minimizes a difference between the feedback signal and the reference signal.

3. The high frequency amplifier of claim 1, wherein the compensation unit is a finite impulse response (FIR) filter configured to set a delay interval as a function of a ratio of a sampling rate to a band of the feedback signal if the transmission signal is generated from the transmission data.

4. The high frequency amplifier of claim 3, wherein the delay interval is adjusted based on the sampling rate and the band of the feedback signal.

5. The high frequency amplifier of claim 3, wherein the error detector is configured to provide the calculated correction value to the FIR filter.

6. The high frequency amplifier of claim 1, further comprising:
a signal converter configured to convert a signal form of the feedback signal and output the converted feedback signal, wherein the error detector is configured to calculate the correction value based on a difference between the converted feedback signal and the reference signal.

7. The high frequency amplifier of claim 6, further comprising:
a digital to analog (D/A) converter configured to convert the output of the data correction unit into an analog signal, wherein the signal converter comprises an analog to digital (A/D) converter configured to convert the feedback signal into a digital signal, and wherein the D/A converter is configured to operate at a high speed than the A/D converter.

8. The high frequency amplifier of claim 6, further comprising:
a first filter configured to filter the reference signal, wherein the signal converter comprises a second filter configured to filter the feedback signal and wherein a pass band of the first filter is wider than a pass band of the second filter.

9. A method to compensate for distortion, the method comprising:
orthogonalizing respective order components of a polynomial model for digital pre-distortion;
correcting transmission data by compensating for a memory effect of a power amplifier to orthogonalize an output;
outputting the corrected transmission data as a reference signal;
amplifying output power of a transmission signal generated from the corrected transmission data;
outputting the amplified output power of the transmission signal as a feedback signal; and
calculating and updating a correction value to correct the transmission data based on the feedback signal and the reference signal.

10. The method of claim 9, wherein the correction value minimizes a difference between the feedback signal and the reference signal.

11. The method of claim 9, further comprising:
converting a signal form of the feedback signal and outputting the converted feedback signal before the amplified output power of the transmission signal is outputted as the feedback signal, wherein calculating and updating the correction value comprises calculating the correction value based on a difference between the converted feedback signal and the reference signal.

12. The method of claim 11, wherein correcting the transmission data comprises converting the reference signal into an analog signal using a digital to analog (D/A) converter, wherein converting the signal form of the feedback signal comprises converting the feedback signal into a digital signal using an analog to digital (A/D) converter, and wherein the D/A converter operates at a high speed than the A/D converter.

13. The method of claim 9, further comprising setting a delay interval as a function of a ratio of a sampling rate to a band of the feedback signal if the transmission signal is generated from the transmission data.

14. The method of claim 13, wherein the delay interval is adjusted based on the sampling rate and the band of the feedback signal.

15. The high frequency amplifier of claim 1, wherein the orthogonalizing unit is configured to use a Gram-Schmidt orthogonalization algorithm.

16. The method of claim 9, wherein orthogonalizing comprises using a Gram-Schmidt orthogonalization algorithm.

17. The method of claim 11, further comprising filtering the reference signal using a first filter, and filtering the feedback signal using a second filter, wherein a pass band of the first filter is wider than a pass band of the second filter.

* * * * *